(12) United States Patent
Bailey et al.

(10) Patent No.: US 7,021,903 B2
(45) Date of Patent: Apr. 4, 2006

(54) FORE-LINE PRECONDITIONING FOR VACUUM PUMPS

(75) Inventors: Christopher M. Bailey, Horsham (GB); Michael S. Boger, Corvallis, OR (US)

(73) Assignee: The BOC Group, Inc., Murray Hill, NJ (US)

(*) Notice: Subject to any disclaimer, the term of this patent is extended or adjusted under 35 U.S.C. 154(b) by 0 days.

(21) Appl. No.: 11/003,125

(22) Filed: Dec. 3, 2004

(65) Prior Publication Data

US 2005/0142010 A1    Jun. 30, 2005

Related U.S. Application Data (63) Continuation-in-part of application No. 10/750,309, filed on Dec. 31, 2003.

(51) Int. Cl.
*F04B 25/00* (2006.01)

(52) U.S. Cl. .................. 417/248; 417/53; 417/313

(58) Field of Classification Search ............... 417/248, 417/313
See application file for complete search history.

(56) References Cited

U.S. PATENT DOCUMENTS

| | | | |
|---|---|---|---|
| 4,636,401 A * | 1/1987 | Yamazaki et al. .......... 427/572 |
| 4,725,204 A * | 2/1988 | Powell ....................... 417/205 |
| 4,784,837 A | 11/1988 | Kitayama et al. |
| 5,616,208 A | 4/1997 | Lee |
| 5,795,399 A | 8/1998 | Hasegawa et al. |
| 5,873,942 A | 2/1999 | Park et al. |
| 5,904,757 A | 5/1999 | Hayashi et al. |
| 5,944,049 A | 8/1999 | Beyer et al. |
| 6,037,272 A | 3/2000 | Park et al. |
| 6,156,107 A | 12/2000 | Hayashi et al. |
| 6,274,507 B1 | 8/2001 | Narita et al. |
| 6,419,455 B1 | 7/2002 | Rousseau et al. |
| 6,435,224 B1 | 8/2002 | Blatt et al. |
| 6,602,323 B1 * | 8/2003 | Chae et al. ..................... 95/8 |
| 6,635,228 B1 * | 10/2003 | Moore et al. ......... 422/186.04 |
| 2002/0034880 A1 | 3/2002 | Sakai et al. |
| 2005/0039425 A1 * | 2/2005 | Olander et al. ........... 55/385.2 |

FOREIGN PATENT DOCUMENTS

EP          1014427 A2      6/2000

* cited by examiner

*Primary Examiner*—Charles G. Freay
(74) *Attorney, Agent, or Firm*—Ira Lee Zebrak (57) ABSTRACT

The present invention is an apparatus and method for evacuating a number of vacuum processing chambers containing incompatible gases. The gases are directed to a subatmospheric abatement chamber containing preconditioning devices. The gases are treated in the abatement chamber to render them compatible. The compatible gases are then drawn from the abatement chamber as a single stream through a backing pump.

25 Claims, 4 Drawing Sheets

FORE-LINE PRECONDITIONING FOR VACUUM PUMPS

RELATED APPLICATIONS

This application is a continuation-in-part of co-pending U.S. application Ser. No. 10/750,309, entitled "Apparatus and Method for Control, Pumping and Abatement for Vacuum Process Chambers," filed Dec. 31, 2003, the contents of which are hereby incorporated by reference in their entirety herein.

FIELD OF THE INVENTION

The present invention relates generally to the field of vacuum pumping, and more particularly, to a method and apparatus for providing high vacuum for multiple chambers with incompatible exhaust components.

BACKGROUND OF THE INVENTION

Certain research and manufacturing processes require the use of a process chamber with high vacuum. The vacuum may be required for several reasons. In some instances, atmospheric components that could cause a chemical reaction or physical damage during the process must be removed (e.g., in vacuum melting of reactive metals such as titanium). In other instances, vacuum is used to disturb an equilibrium condition existing at normal room conditions, such as in removing volatile liquid or occluded or dissolved gas from the bulk of material (e.g., degassing oils, freeze-drying) or in desorbing gas from surfaces (e.g., the cleanup of microwave tubes during manufacture). Vacuum is also used in processes where the distance must be extended that a particle must travel before it collides with another, thereby permitting the particles to follow a collision-free course between source and target (e.g., in vacuum coating, particle accelerators, television picture tubes). Finally, vacuum is used in preparing clean surfaces, by reducing the number of molecular impacts per second. That decreases the chances of contamination (e.g., in clean-surface studies and preparation of pure, thin films).

In semiconductor wafer processing, vacuum is used during the thin-film deposition and etching operations, primarily to reduce contamination. The vacuum system of the invention, while described herein primarily in connection with a semiconductor wafer manufacturing operation, may be used in processes and research activities requiring any of the above uses of vacuum.

The realities of vacuum pump design are such that no one vacuum pump has been built that will operate in a pressure range from one atmosphere down to a "high vacuum" of $10^{-6}$ torr or lower, with a sufficient pumping speed to meet the requirements of some applications. Instead, to achieve a vacuum high enough for thin-film coating and other high vacuum applications, a pumping system that includes both a primary oil-sealed or dry pump and a secondary, high-vacuum molecular pump is used. The rotary oil-sealed or dry primary pump (or forepump or backing pump) "roughs" the process chamber down to a "low vacuum" pressure of about 0.1 torr, after which the secondary high-vacuum molecular pump and rotary pump are used in series to evacuate the process chamber down to high-vacuum levels needed for processing.

One reason for the use of two pump mechanisms in a high vacuum pumping system is that there are two physical regimes to consider in pumping a vacuum. In the low vacuum range, down to about $10^{-1}$ or $10^{-2}$ torr, air molecules interact. Under those conditions, air has viscous qualities and flows like a fluid, and can therefore be pumped using an oil-sealed or dry rotary pump.

At high vacuum pressures the molecules are independent of each other, resulting in "molecular flow." A pump must work on each molecule. Under those conditions, "pumping" is really providing a point of no return (or low probability of return) in a system characterized by random molecular movement. A molecular pump provides such a point of no return.

Oil sealed pumps and dry rotary pumps are both used in vacuum pumping systems as backing pumps. In general, both types of pump rely on confining a volume of gas in a pumping chamber that is reduced in volume before exhausting on the high pressure side of the pump. Various geometric configurations are used in rotary vacuum pumps, including rotary vane pumps and interdigitated shapes rotating on parallel shafts.

Oil sealed rotary vane pumps comprise a single shaft driving a rotor with sliding vanes; the rotor and vanes rotate within an eccentric stator. The pump may have a single stage or may have two stages in series, with the larger first stage exhausting into a smaller secondary stage. The entire mechanism is immersed in oil for lubrication, sealing and cooling.

Known configurations of dry pumps include hook and claw, tongue and groove and screw geometries, and Roots pumps, among others. There is no oil in the dry pump mechanism; sealing is instead effected by close running clearances. While dry pumps are generally more difficult to manufacture and therefore more costly, they are preferred in the semiconductor manufacturing industry because they introduce fewer contaminants into the system, and because the oil in an oil-sealed pump tends to absorb corrosive process gasses and thereby degrade the pump.

Several techniques have evolved for pumping gas on a molecular level. Those include the diffusion pump that imparts momentum using a jet of vapor to move molecules in the vacuum chamber toward the exhaust. Gas capture pumps remove molecules by ion entrapment, freezing (cryo pumps) or by burying the gas under a constantly deposited film of metal.

Turbo pumps (or turbo molecular pumps) utilize a turbine-like rotor that accelerates molecules in the exhaust direction, increasing the probability that a molecule will move out of the chamber toward the backing pump. That technique has come to be used in applications where cleanliness is critical, because there is no problem with the back streaming of any materials used in the pumping mechanism; i.e., the pumping mechanism is dry.

None of the molecular pumps (diffusion, gas capture or turbo) is capable of efficient operation at atmospheric pressure. For that reason, as described above, a vacuum chamber is first evacuated to a roughing pressure of about 1 torr to $10^{-2}$ torr using a roughing pump, followed by further evacuation by a high-vacuum molecular pump. The molecular pump therefore typically has an exhaust pressure of about 1 torr to $10^{-2}$ torr throughout its duty cycle, although pumps capable of exhausting to a greater pressure are known in the art.

Abatement equipment must be used in many applications to condition exhaust in order to control the release of dangerous gasses into the atmosphere and to recapture materials used in the manufacturing process. One example of an abatement device is a scrubber, which removes material from an effluent by injecting a liquid or gas into the effluent. Available scrubbers include wet scrubbers and dry scrubbers.

In a wet scrubber, the process exhaust is forced into a spray chamber, where fine water particles dissolve gasses and entrain dust and particles, removing them from the gas stream. The dust- and solute-laden water is then treated to remove the captured material. The water may be recycled.

In a dry scrubber, a gas may be injected into the exhaust to chemically change hazardous gasses in the exhaust stream. Dry scrubbers may use a variety of techniques to remove the unwanted gasses, including thermal oxidation with or without additional fuel or oxidant, adsorption (hot or cold), and catalytic and plasma processes. Scrubbers are also known that comprise a dry stage feeding a wet stage.

Traps are also available that simply collect dust. Those traps may be atmospheric or low pressure. They may use a filter or a cyclone.

In a typical vacuum system for the manufacture of semiconductor wafers or for other reactive gas processes, a single turbo molecular pump and a single backing pump are provided in series to service a single process vacuum chamber, the turbo molecular pump being nearest the vacuum chamber. Four vacuum process chambers are typically provided on a single manufacturing tool. One or more abatement devices may be used for removing excess process gasses from the exhaust. If the abatement device is between the turbo and backing pump, currently one abatement unit is required per chamber. If the abatement device is atmospheric, i.e., downstream of the backing pumps, one abatement device may be shared among several chambers, provided that the unabated gasses are compatible, or provided that the abatement device acts sufficiently on the gas streams to render the gases compatible before they mix. One backing pump is currently required per chamber irrespective of chamber configuration to avoid pressure fluctuations in one chamber disturbing the pressures in the other chambers.

Various systems have been implemented for regulating pressure inside the vacuum chamber. In one such system, described in U.S. Pat. No. 6,419,455 to Rousseau et al., issued Jul. 16, 2002, the speeds of rotation of a turbo molecular pump and a backing pump are controlled simultaneously to achieve a predetermined pressure profile in the chamber.

Another system, described in European Patent Application EP 1014427 A2, published Jun. 28, 2000, uses a multiple-inlet secondary (low vacuum) pump in evacuating a plurality of process chambers. The secondary pump inlets may be connected to high vacuum pumps.

U.S. Pat. No. 5,873,942 to Park et al., issued Feb. 23, 1999, shows a vacuum exhaust system wherein several high-vacuum pumps are backed by a single low-vacuum pump. Gate valves are placed between the high vacuum pumps and the low vacuum pump. Abatement and incompatibility of the reactive gasses is not addressed.

A system described in U.S. Pat. No. 5,944,049 to Beyer et al., issued Aug. 31, 1999, utilizes a control valve placed on the exhaust side of a high vacuum pump. The control valve is used for regulating vacuum inside the process chamber.

Typical semiconductor wafer processing systems have several vacuum chambers with an independent vacuum pumping system for creating and maintaining a vacuum in the chamber. Process cycles within the chambers are run independently, with reactive gasses being admitted as required at various pressures.

The initial cost of installing such a system is high, due in part to the many duplicate components such as abatement devices and backing pumps. For similar reasons, maintenance costs for such a system are high and the system occupies a large amount of space.

A semiconductor wafer processing system typically has several successive steps in which a substrate is sequentially exposed to a series of reactive gasses. Those steps take place in separate process vacuum chambers, and involve different and often incompatible reactive gasses. In those cases, the four or more vacuum chambers on a single semiconductor manufacturing tool may emit exhaust gasses that may not be mixed unconditionally in a vacuum exhaust system.

Traps for treating multiple impurities are available. For example, a system described in U.S. Pat. No. 4,784,837 to Kitayama et al., issued Nov. 15, 1988, utilizes an absorbent and process for removing multiple materials from semiconductor processing gasses. Similarly, U.S. Pat. No. 5,904,757 to Hayashi et al., issued May 18, 1999, discloses a trap for removing several reaction byproducts from the exhaust of a single semiconductor processing chamber.

There is therefore presently a need to provide a vacuum exhaust apparatus and method that uses a single low-vacuum pump for backing several high-vacuum pumps evacuating several process chambers. Particularly, the apparatus and method should be suitable for use with two or more process chambers having incompatible process materials in their exhaust gasses. To the inventors' knowledge, there is currently no such technique available.

SUMMARY OF THE INVENTION

The present invention addresses the needs described above by providing an apparatus and method for exhausting a plurality of process vacuum chambers without requiring a complete vacuum system for each chamber, while tolerating incompatible exhaust components from the chambers. In one embodiment, a vacuum exhaust apparatus for exhausting gas from at least two process vacuum chambers containing dissimilar gasses is provided. The apparatus includes a sub-atmospheric abatement chamber having at least two inlets and an outlet. The at least two inlets receive the gasses from the at least two process vacuum chambers. The apparatus further includes a backing pump connected to the outlet of the sub-atmospheric chamber, for maintaining vacuum within that chamber. The sub-atmospheric abatement chamber contains at least one pre-conditioner for conditioning at least one of the received gasses from the process vacuum chambers differently from another of the gasses. In that way, the gasses are made compatible for mixing.

In the vacuum exhaust apparatus, the at least one pre-conditioner may be an abatement device. Specifically, it may be a plasma ionization device, a chemical burning device, a chemical neutralization device or a filter. The sub-atmospheric abatement chamber may include a plurality of abatement devices, each for conditioning a gas from a respective process chamber.

The vacuum exhaust apparatus may further include a turbo molecular pump connected to an exhaust port of a process chamber; wherein an exhaust of said turbo molecular pump connects to an inlet of said sub-atmospheric abatement chamber. The turbo molecular pump may be capable of exhausting to a pressure of over 1 torr, or may be capable of exhausting to a pressure of over 5 torr. The apparatus may have a throttle valve connected to an exhaust side of the turbo molecular pump.

The sub-atmospheric chamber may be proximate the process chambers, or may be remote from the process chambers. An internal volume of the sub-atmospheric chamber may reduce an effect of pressure changes in one of the process chambers on pressure in another of the process chambers.

The backing pump may be proximate the sub-atmospheric abatement chamber.

The apparatus may further include an atmospheric abatement device connected to an exhaust side of the backing pump. The atmospheric abatement device may be a device selected from the group consisting of a wet scrubber, a dry scrubber and a combination dry/wet scrubber.

The apparatus may be for exhausting four process vacuum chambers, wherein the sub-atmospheric abatement device has four inlets.

In another embodiment of the invention, a semiconductor manufacturing system is provided. The system includes a plurality of semiconductor vacuum processing chambers, and a single sub-atmospheric abatement chamber connected to receive exhaust from each of said vacuum processing chambers. In that way, all of the vacuum processing chambers exhaust into the single sub-atmospheric abatement chamber. The system also includes abatement means in the sub-atmospheric abatement chamber for conditioning exhaust in the sub-atmospheric abatement chamber. The abatement means is arranged to treat exhaust from at least one of the process chambers differently from another of the process chambers, whereby the exhausts are made compatible with each other. A single backing pump is connected to the sub-atmospheric abatement chamber for maintaining sub-atmospheric pressure in the sub-atmospheric abatement chamber.

The system may include an atmospheric abatement chamber connected to an exhaust of the backing pump.

The system may include a plurality of pressure control units, each of which is connected to one processing chamber for evacuating the chamber, and is further connected to an inlet of the sub-atmospheric abatement chamber. Each of the pressure control units may include a turbo pump connected for evacuating a process chamber, and a throttle valve connected to an exhaust side of the turbo pump. Each control unit of the plurality of pressure control units may be connected directly to the sub-atmospheric abatement chamber, or may be connected remotely to the sub-atmospheric abatement chamber.

The abatement means in the sub-atmospheric abatement chamber may be selected from a group consisting of a plasma ionization device, a chemical burning device, a chemical neutralization device and a filter.

Each of the vacuum processing chambers may be located within a clean room, and the sub-atmospheric abatement chamber may be located outside the clean room. The internal volume of the sub-atmospheric chamber reduces an effect of pressure changes in one of the processing chambers on pressure in another of the processing chambers.

In another embodiment of the invention, a method is provided for exhausting gasses from a plurality of process vacuum chambers, where the exhaust gasses from at least two of the process vacuum chambers are incompatible with each other. The exhaust gasses from each of the process vacuum chambers are received in a subatmospheric abatement chamber. Within the subatmospheric abatement chamber, the exhaust gasses from at least one of the at least two process vacuum chambers having incompatible gasses are preconditioned, whereby the incompatible gasses are rendered compatible. The compatible exhaust gasses are pumped through a single passage from the subatmospheric abatement chamber to a backing vacuum pump, whereby the subatmospheric abatement chamber is maintained at subatmospheric pressure.

The method may also include the step of transferring the exhaust gases from at least one of the process vacuum chambers to the subatmospheric abatement chamber with a turbo-molecular pump.

The step of pumping the exhaust gases from the subatmospheric abatement chamber may further comprise maintaining the subatmospheric pressure in the abatement chamber between 5 and 10 torr.

The step of preconditioning the exhaust gases may include subjecting the exhaust gases to at least one process selected from a group consisting of plasma ionization, chemical burning, chemical neutralization and filtering.

DESCRIPTION OF THE INVENTION

The present invention is a system and method for evacuating a plurality of process chambers and for controlling the pressures of those chambers. The system reduces capital cost, maintenance and space requirements as compared to the prior art.

The invention will be described with respect to one embodiment in which four semiconductor processing chambers are evacuated and maintained at process vacuum pressure. One skilled in the art will recognize that the system may be used in other applications requiring high vacuum, and may be used in the evacuation of more or fewer than four chambers.

Figure 1:
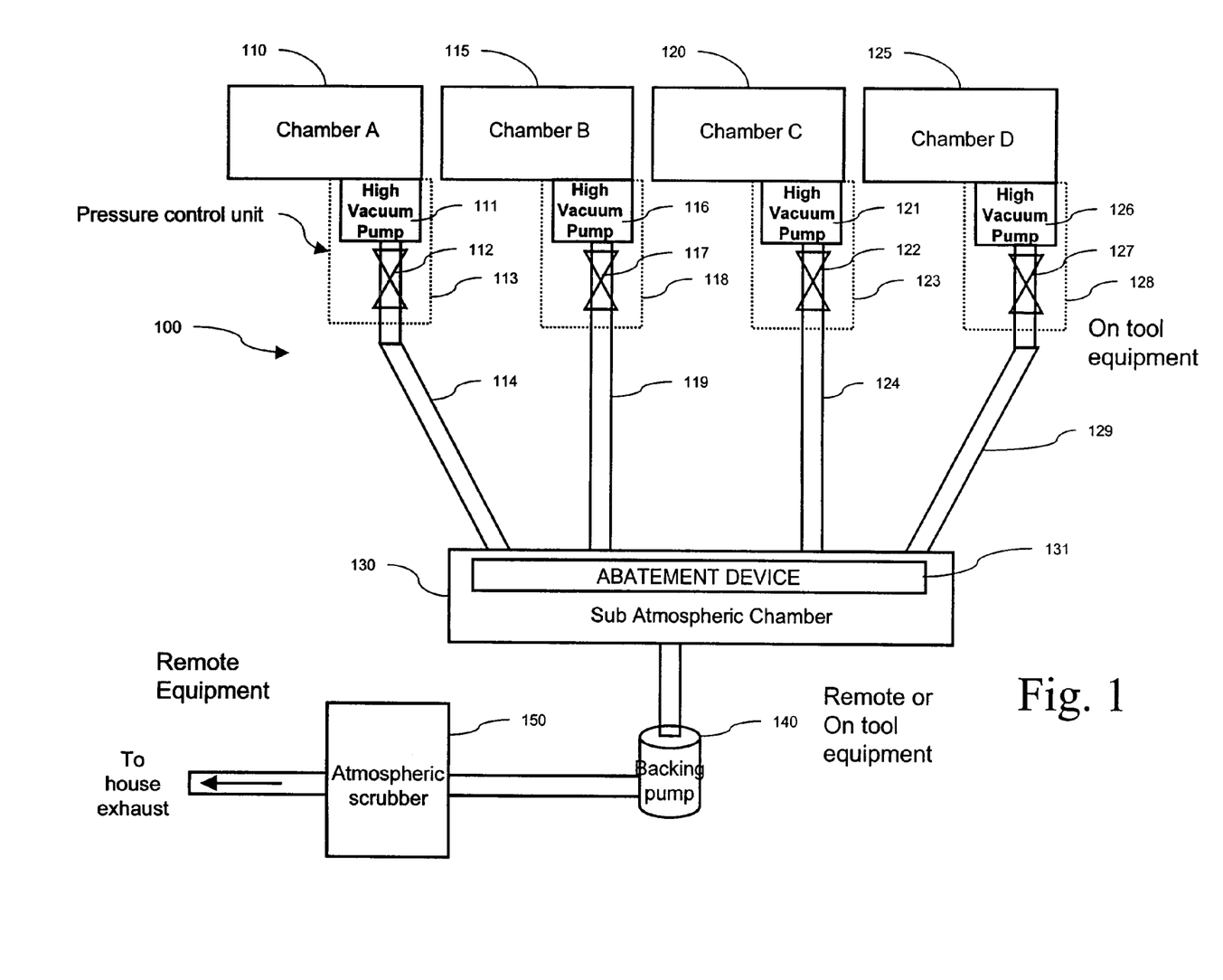
FIG. 1 is a schematic diagram showing the functional elements of a vacuum exhaust apparatus according to one embodiment of the invention.

A system 100 according to the invention is shown in FIG. 1. The system includes, for each of four process chambers A–D (110, 115, 120, 125), a pressure control unit 113, 118, 123, 128 that comprises a turbo molecular high-vacuum pump 111, 116, 121, 126 and a means for controlling exhaust back pressure, such as a throttle valve 112, 117, 122, 127, arranged to throttle the exhaust of the turbo molecular pump.

In the exemplary embodiment presented herein, the high-vacuum pump is a turbo molecular pump. As is noted above, other high-vacuum pumping technologies such as diffusion or gas capture may alternatively be used, and the invention is therefore not limited to the use of a turbo molecular pump as the high-vacuum pump. The high-vacuum pump used in the presently described system is not capable of exhausting to atmospheric pressure, but must be capable of exhausting to an exhaust pressure that is higher than normal for a turbo molecular pump. While a typical turbomolecular pump exhausts up to about 1 torr, the system of the present invention requires a pump capable of exhausting up to about 5–10 torr. Such a turbomolecular pump is within the scope of the known art, and will therefore not be described in detail herein.

The pressure control units 113, 118, 123, 128 are arranged to control pressure in the chambers A–D independently of the operation of the backing pump 140. The pressure control units 113, 118, 123, 128 are preferably located on the manufacturing tool equipment. In the presently described embodiment, the units are mounted on a multi-chamber semiconductor manufacturing tool, with each pressure control device mounted on or near a corresponding chamber. In a typical application, the tool is contained in a clean room to reduce contaminants. The pressure control units 113, 118, 123, 128 are also contained within the clean room.

Each of the pressure control units 113, 118, 123, 128 exhausts into a single, multi inlet sub-atmospheric chamber 130. The sub-atmospheric chamber has one inlet for each of the exhausts. In one embodiment of the invention, the chamber 130 is located remotely from the pressure control units 113, 118, 123, 128, and connected by exhaust lines 114, 119, 124, 129. In that case, the sub-atmospheric chamber 130 maybe located outside the clean room and may therefore be serviced more easily. The closer the sub-atmospheric chamber is located to the process chambers, the lower the cost of the system, although maintenance considerations of the sub-atmospheric chamber may dictate that it is located outside of the cleanroom.

The presence of a turbomolecular pump and throttle valve of the pressure control units 113, 118, 123, 128 provides a degree of isolation between the exhaust lines 114, 119, 124, 129 and the process chambers 110, 115, 120, 125 to allow the exhausts from all the process chambers on the tool (four in the present example) to be connected to a single chamber 130. Those devices, however, have only a limited response and therefore do not completely isolate the chambers. The internal volume of the sub-atmospheric chamber provides additional buffer that reduces the effect of pressure changes in one chamber affecting the pressures in the other chambers.

In a preferred embodiment of the invention, an abatement device 131 is provided within the sub-atmospheric chamber 130. Inside the abatement device 131, effluent gasses, particularly PFCs, are caused to react by plasma or other means to convert the effluent to a water reactive or water-soluble gas. The by-product is exhausted to a backing vacuum pump. A plasma abatement device is known in the art and will therefore not be additionally described herein. One skilled in the art will recognize that other available abatement technology may be used in the presently described system while remaining within the scope of the invention.

In addition to the function of removing gasses from the process effluent, the abatement device 131 may also function to provide additional pressure isolation among the process chambers 110, 115, 120, 125. Furthermore, the abatement device 131 protects downstream hardware from the effects of cross reactions from the chambers.

The sub-atmospheric chamber 130 is evacuated and maintained at a backing pressure by a backing pump 140. The backing pump is preferably a dry running vacuum pump as is commonly used in the industry, and must be compatible with the exhausted byproducts from the abatement device.

The backing pump must be properly sized for the required pressure and flow. The size of the backing pump 140 depends on the flow rate requirements and chamber pressure requirements of the system. Backing pump size is also a function of the distance between the pressure control units 112, 118, 125, 128 and the sub-atmospheric chamber 130; i.e., pump size increases with distance. The pump may be located close to the sub-atmospheric chamber 130 or remote from it.

The size of the backing pump is also a function of the backing pressure. The greater the fore line pressure in a vacuum system, the smaller the backing pump may be. Because a higher turbo pump exhaust pressure than normal is used in the present system, the fore line pressure is higher and a smaller backing pump may be used, saving capital and energy costs, and conserving space.

In accordance with the present invention, a single backing pump 140 is used to provide a vacuum exhaust pressure for a plurality of turbo molecular pumps, while the process chamber pressures are independently controlled. That is made possible by the placement of the throttle valves 112, 117, 122, 127 and the sub-atmospheric chamber 130 between the backing pump 140 and the turbomolecular pumps. The sub-atmospheric chamber and the throttle valves both contribute to absorbing pressure pulsations and otherwise at least partially isolating pressure changes among the process chambers. That effect is further enhanced by the abatement device 131, if used.

The backing pump 140 exhausts into an atmospheric scrubber 150 that may be a wet scrubber or a dry scrubber, but preferably is a combination of the two. If PFCs have been treated in the sub-atmospheric abatement device 131, then the most cost effective technology is likely to be a wet scrubber, although other technologies may be appropriate.

The combination described above offers several advantages over the current art. For example, no throttle valves are necessary at the inlets of the turbo pumps. By moving the throttle valve to the exhaust of the turbo pump, particles generated or captured by the throttle valve are far less likely to find their way back to the process chamber and possibly to a wafer surface. Furthermore, if the throttle valve is at the exhaust side of the turbo pump, the need for maintenance is much reduced, from typically an 18 month period to a one month period. Additionally, a valve operating at a higher pressure may be smaller, cheaper and less susceptible to leaks and maintenance.

Further, in the presently described arrangement, the size and position of the backing pump are not constrained by process chamber pressure control. That is an improvement over some currently implemented solutions that control the backing pump as part of the process chamber pressure control. In those systems, the size and location of the backing pump are critical to system performance.

The presently described system utilizes a single sub-atmospheric chamber, backing pump and abatement device for exhausting four or more process chambers. Such an arrangement has clear advantages of lower initial capital costs, less maintenance and lower space requirements.

Figure 2:
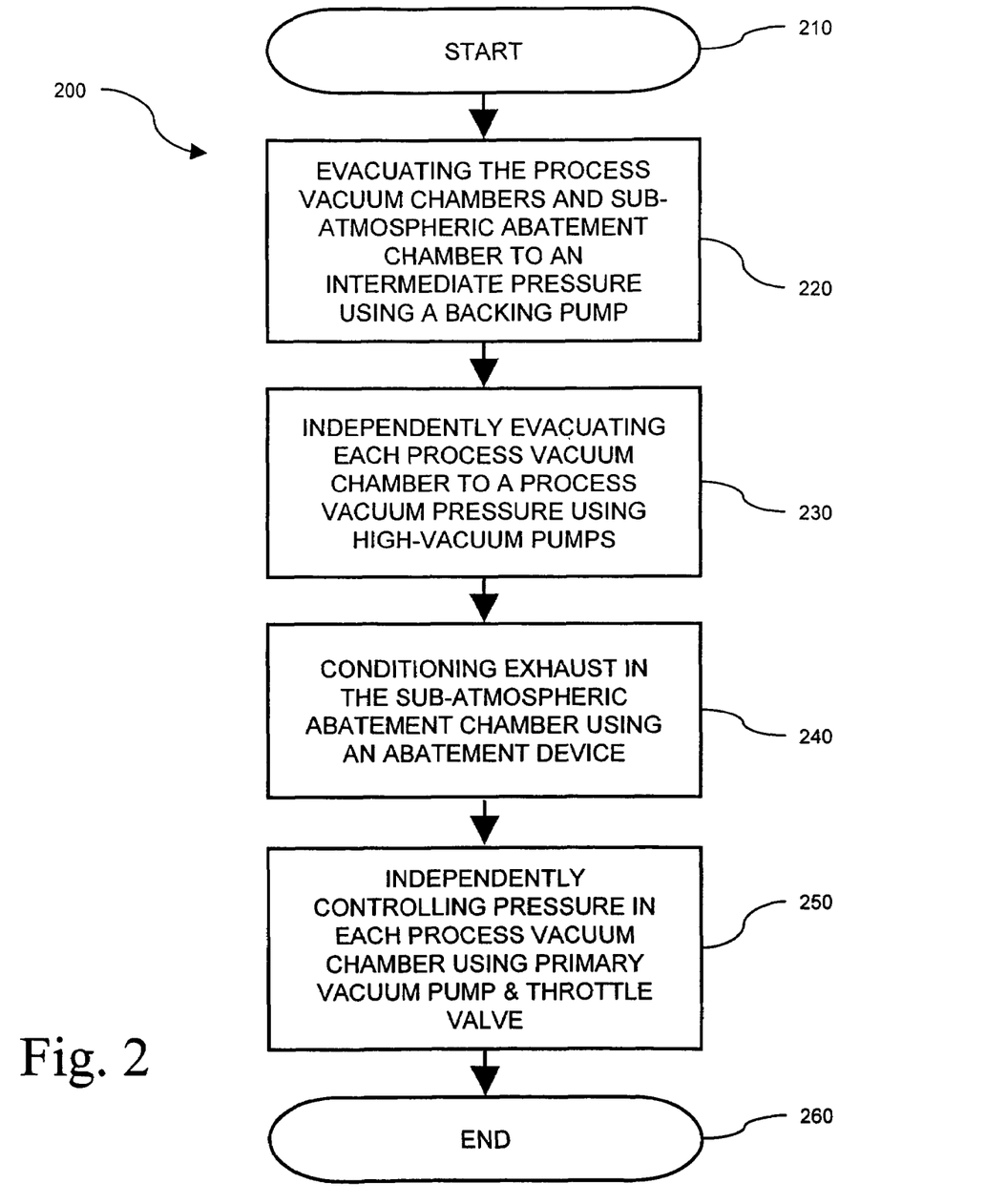
FIG. 2 is a block diagram showing a method according to one embodiment of the invention.

Another embodiment of the invention is a process 200 for exhausting gas from a plurality of process vacuum chambers to achieve a process vacuum pressure. As shown in FIG. 2, the process starts (step 210) with evacuating (step 220) the process vacuum chambers and a sub-atmospheric abatement chamber. Those chambers are evacuated to an intermediate vacuum pressure greater than the process vacuum pressure. The chambers are evacuated using a backing pump connected to an outlet of the abatement chamber. The intermediate vacuum pressure may be between 5 and 10 torr.

The method further includes the step of independently evacuating (step 230) to the process vacuum pressure each of the process vacuum chambers. The process vacuum chambers are evacuated using a plurality of high-vacuum pumps, one for each chamber. Each of the high-vacuum pumps exhausts, directly or indirectly, into an inlet of the sub-atmospheric abatement chamber.

Finally, the method includes conditioning the exhaust (step 240) from the sub-atmospheric abatement chamber using an abatement device.

The method may also include independently controlling (step 250) the pressure in each of the process vacuum chambers using a corresponding throttle valve at an exhaust side of each high-vacuum pump. The sub-atmospheric abatement chamber and the throttle valves provide sufficient isolation of the process chambers to permit such independent control. An end step 260 completes the method.

Many of the agents used in semiconductor manufacturing, and some of the process byproducts, are highly reactive. Exhaust gasses from the process chambers are therefore frequently incompatible, and it is highly undesirable to mix untreated exhaust gasses from many combinations of chambers.

On the other hand, vacuum chambers used sequentially in a wafer manufacturing process, and producing incompatible exhaust gasses, are often collocated on a common tool and are ideal candidates for the use of a common subatmospheric abatement chamber and backing pump as described above. The inventors have discovered an apparatus and technique that permit the use of a common subatmospheric abatement chamber for incompatible exhaust gasses.

Figure 3:
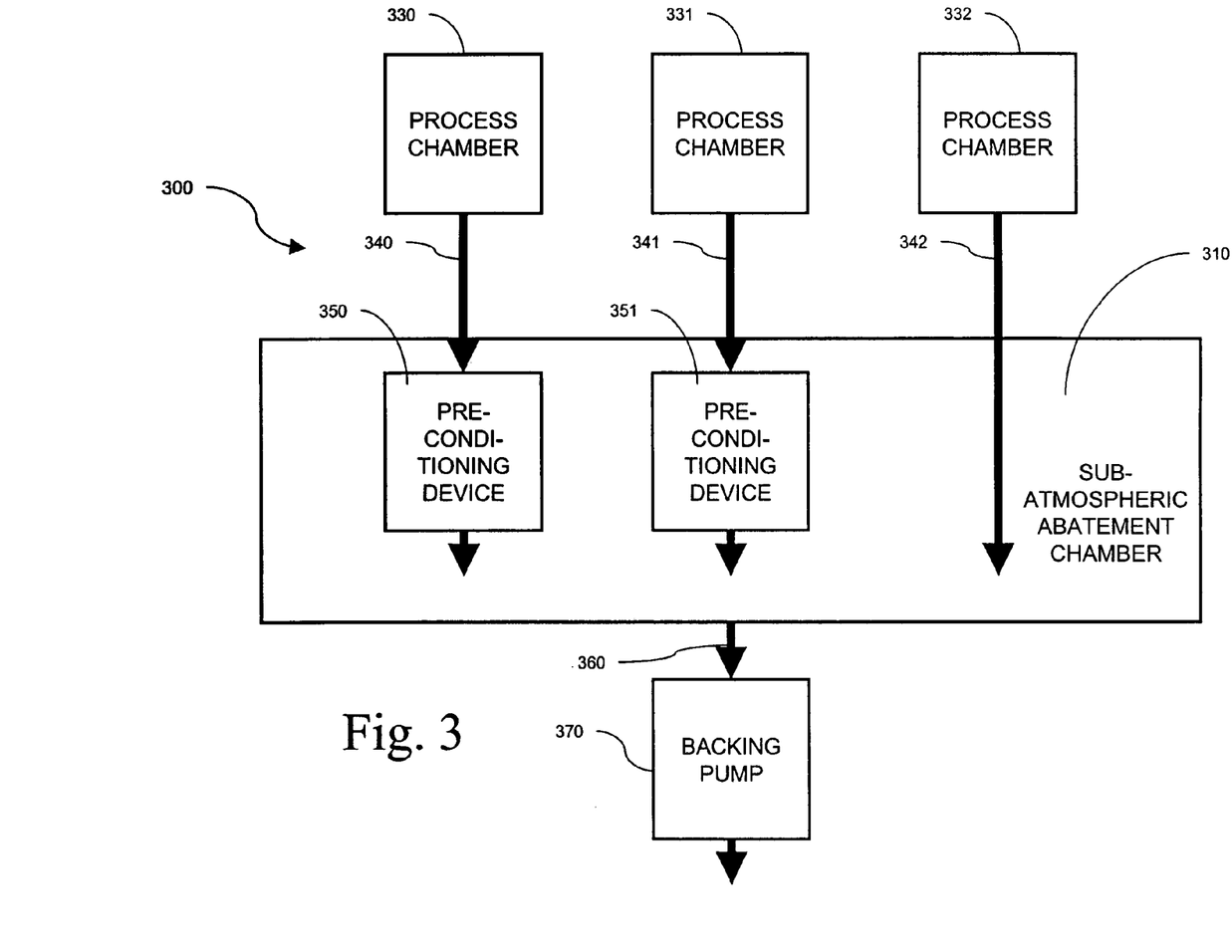
FIG. 3 is a schematic diagram showing the functional elements of a sup-atmospheric abatement chamber according to one embodiment of the invention.

A fore-line conditioning system 300 including a sub-atmospheric abatement chamber 310 according to the invention is shown in FIG. 3. Three process chambers 330, 331, 332 produce three different exhaust gasses. In the example shown, the exhaust gasses from process chamber 330 and process chamber 331 are highly reactive with each other and with the exhaust from process chamber 332.

Each of the process chambers 330, 331, 332 may include a turbo molecular pump or other high vacuum pump (not shown). The chambers exhaust through lines 340, 341, 342 into the subatmospheric abatement chamber 310.

The subatmospheric abatement chamber 310 includes several pre-conditioning abatement devices 350, 351. Those devices may, for example, be plasma ionization devices, chemical burning devices, chemical neutralization devices, filters or other devices known in the art, or any combination of those devices.

Preconditioning device 350 receives exhaust gasses through the incoming vacuum line 340 from the process chamber 330. The preconditioning devices may exhaust directly (as shown) into the interior of the subatmospheric abatement chamber 310, where the then-compatible gasses mix and exit through the line 360. Alternatively, outlets of certain ones of the preconditioning device may join outlets of other preconditioning devices before exhausting into the subatmospheric chamber.

The line 342 from process chamber 332 enters the subatmospheric abatement chamber directly, without passing though a preconditioning device. That arrangement may selectively be used in the system of the present invention where an exhaust gas from a process chamber is compatible with preconditioned gasses from other process chambers.

The subatmospheric chamber 310 is exhausted through line 360 by a backing pump 370. The backing pump maintains the subatmospheric chamber at subatmospheric pressure. The backing pump also maintains each of the preconditioning devices 350, 351 contained within the sub-atmospheric chamber, at a subatmospheric pressure.

While the inventive system is described as having pre-conditioning devices for treating two of three lines entering the subatmospheric chamber, one skilled in the art will recognize that any number of other configurations may be used to handle other combinations of lines entering the subatmospheric abatement chamber. The exact configuration will depend largely on the reactivity and compatibility of the exhaust gasses carried in the particular lines entering the chamber.

Because the preconditioning devices exhaust into a single subatmospheric abatement chamber, the advantages of using a single abatement chamber as described above continue to benefit the system. For example, the volume of the abatement chamber acts as a pressure buffer, preventing a pressure rise in one incoming line from adversely affecting pressures in the other lines.

Further, there are clear economic, maintenance and reliability benefits to using a single abatement chamber and backing pump to service multiple process chambers, as noted above. By preconditioning the incoming lines as required for compatibility of the gasses, the present invention reaps the economic benefits of using a single backing pump and abatement chamber to service multiple process chambers and turbo pumps. Preconditioning the exhausts of the process chambers permits the system of the invention to be used to exhaust sequential process chambers where the exhaust gasses would not otherwise be compatible.

Figure 4:
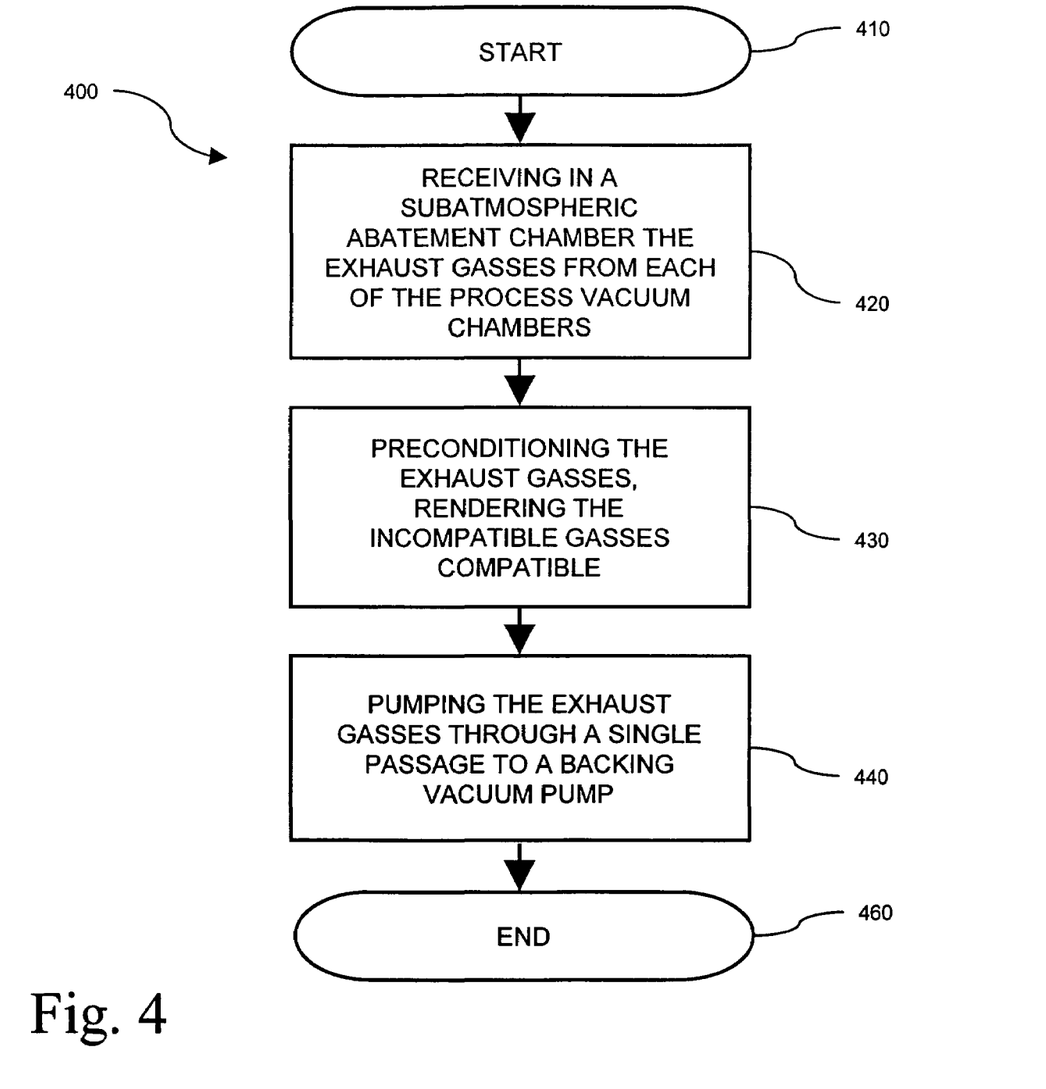
FIG. 4 is a block diagram showing a method according to one embodiment of the invention.

A method 400 according to one embodiment of the invention is illustrated by the flow chart of FIG. 4. After the process is started 410, the exhaust gasses from each of the process vacuum chambers are received (step 420) in the subatmospheric abatement chamber. In a preferred embodiment, the gasses from at least some of the process chambers are received from exhaust ports of turbo-molecular pumps.

Within the subatmospheric abatement chamber, the exhaust gasses from at least one of the at least two process vacuum chambers having incompatible gasses are preconditioned (step 430). The incompatible gasses are thereby rendered compatible. The compatible exhaust gases are then pumped (step 440) through a single passage from the subatmospheric abatement chamber to a backing vacuum pump. An end step 460 completes the method.

The backing vacuum pump maintains the subatmospheric abatement chamber at subatmospheric pressure. In one embodiment, the abatement chamber is maintained at a pressure of about $5^{-10}$ Torr.

The foregoing Detailed Description is to be understood as being in every respect illustrative and exemplary, but not restrictive, and the scope of the invention disclosed herein is not to be determined from the Description of the Invention, but rather from the Claims as interpreted according to the full breadth permitted by the patent laws. For example, while the system is described in connection with the use of several exemplary pre-conditioning techniques in the sub-atmospheric chamber, including plasma ionization, chemical burning, chemical neutralization and filtering, other preconditioning techniques may be used. It is to be understood that the embodiments shown and described herein are only illustrative of the principles of the present invention and that various modifications may be implemented by those skilled in the art without departing from the scope and spirit of the invention.

What is claimed is:

1. A vacuum exhaust apparatus for exhausting at least two process vacuum chambers containing dissimilar gasses, comprising:
   at least two turbo molecular pumps, connected to exhaust ports of the process vacuum chambers;
   a sub-atmospheric abatement chamber having at least two inlets and an outlet, said at least two inlets receiving the gasses from the at least two turbo molecular pumps;

a backing pump connected to the outlet of the sub-atmospheric chamber, for maintaining vacuum within that chamber;

the sub-atmospheric abatement chamber containing at least one pre-conditioner for conditioning at least one of the received gasses from the process vacuum chambers differently from another of the gasses, whereby the gasses are made compatible for mixing.

2. The vacuum exhaust apparatus of claim 1, wherein the at least one pre-conditioner is an abatement device selected from a group consisting of a plasma ionization device, a chemical burning device, a chemical neutralization device and a filter.

3. The vacuum exhaust apparatus of claim 1 wherein the sub-atmospheric abatement chamber comprises a plurality of abatement devices, each for conditioning a gas from a respective process chamber.

4. The vacuum exhaust apparatus of claim 1, wherein the turbo molecular pumps are capable of exhausting to a pressure of over 1 torr.

5. The vacuum exhaust apparatus of claim 1, wherein the turbo molecular pumps are capable of exhausting to a pressure of over 5 torr.

6. The vacuum exhaust apparatus of claim 1, further comprising throttle valves connected to exhaust sides of the turbo molecular pumps.

7. The vacuum exhaust apparatus of claim 1, wherein the sub-atmospheric chamber is proximate the process chambers.

8. The vacuum exhaust apparatus of claim 1, wherein the sub-atmospheric chamber is remote from the process chambers.

9. The vacuum exhaust apparatus of claim 1, wherein an internal volume of the sub-atmospheric chamber reduces an effect of pressure changes in one of the process chambers on pressure in another of the process chambers.

10. The vacuum exhaust apparatus of claim 1, wherein the backing pump is proximate the sub-atmospheric abatement chamber.

11. The vacuum exhaust apparatus of claim 1, further comprising an atmospheric abatement device connected to an exhaust side of the backing pump.

12. The vacuum exhaust apparatus of claim 11, wherein the atmospheric abatement device is a device selected from the group consisting of a wet scrubber, a dry scrubber and a combination dry/wet scrubber.

13. The vacuum exhaust apparatus of claim 1, for exhausting four process vacuum chambers, wherein the sub-atmospheric abatement device has four inlets.

14. A semiconductor manufacturing system, comprising:
a plurality of semiconductor vacuum processing chambers;
a single sub-atmospheric abatement chamber connected to receive exhaust from each of said vacuum processing chambers, whereby all of said vacuum processing chambers exhaust into the single sub-atmospheric abatement chamber;
abatement means in the sub-atmospheric abatement chamber for conditioning exhaust in the sub-atmospheric abatement chamber, said abatement means being arranged to treat exhaust from at least one of said process chambers differently from another of said process chambers, whereby the exhausts are made compatible with each other; and
a single backing pump connected to the sub-atmospheric abatement chamber for maintaining sub-atmospheric pressure of between 5 and 10 torr in the sub-atmospheric abatement chamber.

15. The semiconductor manufacturing system of claim 14, further comprising an atmospheric abatement chamber connected to an exhaust of the backing pump.

16. The semiconductor manufacturing system of claim 14, further comprising a plurality of pressure control units, each said pressure control unit connected to one processing chamber for evacuating said chamber, and further connected to an inlet of the sub-atmospheric abatement chamber.

17. The semiconductor manufacturing system of claim 16, wherein each said pressure control unit comprises a turbo molecular pump connected for evacuating a process chamber, and a throttle valve connected to an exhaust side of the turbo molecular pump.

18. The semiconductor manufacturing system of claim 16, wherein each control unit of the plurality of pressure control units is connected directly to the sub-atmospheric abatement chamber.

19. The semiconductor manufacturing system of claim 16, wherein each of the plurality of pressure control units is connected remotely to the sub-atmospheric abatement chamber.

20. The semiconductor manufacturing system of claim 14, wherein the abatement means in the sub-atmospheric abatement chamber is selected from a group consisting of a plasma ionization device, a chemical burning device, a chemical neutralization device and a filter.

21. The semiconductor manufacturing system of claim 14, wherein each of the vacuum processing chambers is located within a clean room, and the sub-atmospheric abatement chamber is located outside the clean room.

22. The semiconductor manufacturing system of claim 14, wherein an internal volume of the sub-atmospheric chamber reduces an effect of pressure changes in one of the processing chambers on pressure in another of the processing chambers.

23. A method for exhausting gasses from a plurality of process vacuum chambers, the exhaust gasses from at least two of the process vacuum chambers being incompatible with each other, the method comprising the steps of:
receiving in a subatmospheric abatement chamber the exhaust gasses from each of the process vacuum chambers;
within the subatmospheric abatement chamber, preconditioning the exhaust gasses from at least one of the at least two process vacuum chambers having incompatible gasses, whereby the incompatible gasses are rendered compatible; and
pumping the compatible exhaust gases through a single passage from the subatmospheric abatement chamber to a backing vacuum pump, whereby the subatmospheric abatement chamber is maintained at a subatmospheric pressure of between 5 and 10 torr.

24. The method of claim 23, further comprising the step of transferring the exhaust gases from at least one of the process vacuum chambers to the subatmospheric abatement chamber with a turbo-molecular pump.

25. The method of claim 23, wherein the step of preconditioning the exhaust gases comprises subjecting the exhaust gases to at least one process selected from a group consisting of plasma ionization, chemical burning, chemical neutralization and filtering.

* * * * *